United States Patent [19]
Koifman et al.

[11] Patent Number: 5,812,027
[45] Date of Patent: Sep. 22, 1998

[54] SPIKE INSENSITIVE INTERMEDIATE FREQUENCY AMPLIFIER

[75] Inventors: Vladimir Koifman, Rishon-Lezion; Yachin Afek, Kfar Saba, both of Israel

[73] Assignee: Motorola, Inc., Schaumburg, Ill.

[21] Appl. No.: 696,076

[22] Filed: Aug. 13, 1996

[51] Int. Cl.⁶ .................................................. H03F 3/45
[52] U.S. Cl. ........................................ 330/258; 330/253
[58] Field of Search .............................. 330/69, 253, 258, 330/302, 306

[56] References Cited

U.S. PATENT DOCUMENTS 5,613,233  3/1997  Vagher ................................ 330/258 X Primary Examiner—James B. Mullins
Attorney, Agent, or Firm—Robert M. Handy; Ziye Zhou

[57] ABSTRACT

The intermediate frequency (IF) amplifier (10) of the invention comprises a differential stage (40) having transistors (41, 42) serially coupled to inductive loads (31, 32). There is only one point at common sources (node 45) which is sensitive to spikes. A feedback stage (60) extracts a common mode spike component at spike frequency ($f_S$) from the output and returns a feedback signal to the sensitive point (node 45). Comparing to traditional differential amplifiers, the common mode rejection at resonance frequencies ($f_R$) can be 30 times higher. This makes the amplifier (10) spike insensitive and suitable for the integration into mixed analog-digital chips, such as DSP chips, where the analog portions operate in the same frequency range as the digital portions.

8 Claims, 1 Drawing Sheet

5,812,027

SPIKE INSENSITIVE INTERMEDIATE FREQUENCY AMPLIFIER

FIELD OF THE INVENTION

This invention relates to amplifiers, especially to intermediate frequency (IF) amplifiers which are spike insensitive.

BACKGROUND OF THE INVENTION

In digital signal processing (DSP) chips comprising digital and analog circuits there is the problem of noise propagation from digital circuits to analog circuits. The digital circuits usually operate in the same frequency range as the analog circuits. Spikes are coupled to the analog circuit from the semiconductor substrate, the supply rails or via parasitic capacities. To reduce unwanted coupling of noise, such as spikes, the analog circuits are designed differentially with two signal channels.

A spike is a short time common mode signal appearing on both signal channels. The frequency spectrum of the spike overlaps with the frequency spectrum of the analog signal. The common mode feedback in analog circuits operates at frequencies less than the spike frequency. It is difficult to obtain sufficient common mode rejection at spike frequencies. In order to reject spikes, there must be a high common mode rejection at high frequencies.

This invention seeks to provide an improved amplifier which overcomes the above mentioned limitations of the prior art.

DETAILED DESCRIPTION OF THE DRAWINGS

The intermediate frequency (IF) amplifier (hereinafter amplifier) of the invention comprises a differential stage of amplifying transistors which are serially coupled to an inductive load. The only spike sensitive point is the node where the main electrodes of the transistors are coupled. A feedback stage comprises parallel coupled feedback transistors. These feedback transistors have one of their main electrodes coupled to the load. The feedback stage operates at the spike frequency ($f_s$). A common mode spike component is extracted by the feedback stage and returned to the sensitive point of the differential stage. In this way, spikes can be compensated.

Figure 1:
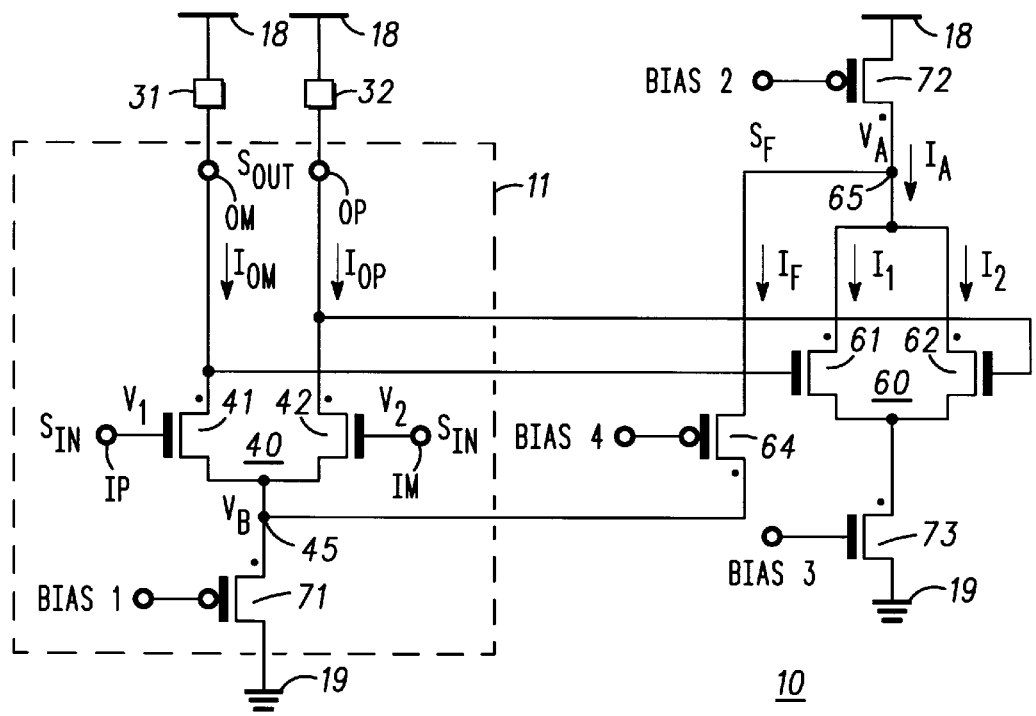
FIG. 1 is a simplified circuit diagram of the amplifier according to the invention.

The amplifier will now be explained in detail. FIG. 1 is a simplified circuit diagram of amplifier 10 according to a preferred embodiment of the invention.

Amplifier 10 has first input IP and second input IM for receiving a differential input signal $S_{in}$. It has first output OM and second output OP for supplying an amplified output signal $S_{out}$ to inductive loads 31 and 32. Amplifier 10 comprises differential stage 40 and feedback stage 60. Amplifier 11 shown by a dashed outline is a typical amplifier of the prior art. Amplifier 11 comprises differential stage 40.

Preferably, amplifier 10 comprises field effect transistors (FETs). This is convenient, but not essential for the invention. In the following, the term 'transistor' means any device having main electrodes (e.g., sources, drains) and control electrodes (e.g., gates).

In FIG. 1, P-channel transistors 64, 72 are indicated by a circle at the gate. Transistors 41, 42, 61, 62, 71, and 73 are N-channel transistors. For convenience, the drains (D) and the sources (S) of the transistors will be distinguished. In FIG. 1, the drain electrodes are indicated by a dot symbol. A person skilled in the art will be able to replace the FETs by other devices taking the gates as control electrodes and the drains and sources as main electrodes.

Differential stage 40 comprises first transistor 41 and second transistor 42 which are differentially coupled. The gates are coupled to first input IP and second input IM, respectively. The drains are coupled to first output OM and second output OP, respectively. The sources are coupled via node 45 and the D-S path of bias transistor 71 to first supply line 19 (e.g., ground). Bias transistor 71 has a gate electrode coupled to receive a first bias voltage identified as BIAS 1. Current is supplied to differential stage 40 via inductive loads 31 and 32 coupled via output OM and output OP to second supply line 18. There is a first signal channel from input IP to output OM and a second signal channel from input IM to output OP.

Feedback stage 60 comprises first feedback transistor 61 and second feedback transistor 62, coupling transistor 64, and bias transistors 72, 73. The drains of feedback transistors 61, 62 are coupled via node 65 and the D-S path of bias transistor 72 to second supply line 18. The sources of feedback transistors 61, 62 are coupled via the D-S path of bias transistor 73 to first supply line 19. The gates of first feedback transistor 61 and second feedback transistor 62 are coupled to the drains of first transistor 41 and second transistor 42 of differential stage 40, respectively.

Bias transistor 72 and 73 have a gate electrode coupled to receive second and third bias voltages identified as BIAS 2 and BIAS 3, respectively.

Node 65 of feedback stage 60 is coupled to node 45 of differential stage 40 via the S-D path of coupling transistor 64. Coupling transistor 64 has a gate electrode coupled to receive a fourth bias voltage identified as BIAS 4.

For further explanations, the following definitions for currents and voltages are used:

In amplifier 10, the input voltages at input IP and input IM are $V_1$ and $V_2$. The difference $\Delta V_{in}=V_1-V_2$ represents the differential input signal $S_{in}$. Accordingly, the voltage difference $\Delta V_{out}$ between output OP and output OM stand for the output signal $S_{out}$. A gain g can be defined as $g=S_{out}/S_{in}=\Delta V_{out}/\Delta V_{in}$.

In differential stage 40, the drain currents of first transistor 41 and second transistor 42 are $I_{OM}$ and $I_{OP}$, respectively. Node 45 has the voltage $V_B$ to ground.

In feedback stage 60, the drain currents of first feedback transistor 61 and second feedback transistor 62 are referred to as $I_1$ and $I_2$, respectively. $I_A$ is the current through bias transistor 72. The voltage at node 65 is $V_A$. Current $I_F$ flows from node 65 to node 45.

The operation of amplifier 10 will now be described. For the purposes of illustration, it is first assumed that the differential input signal $S_{in}$ having the signal frequency $f_0$ is supplied to input IP and input IM. It is also assumed initially that there is no spike signal. $\Delta V_{in}$ is differentially amplified by transistors 41, 42 and transferred into output signal $S_{out}$. For positive $\Delta V_{in}$, the current $I_{OM}$ of transistor 41 is larger than $I_{OP}$ of transistor 42. For negative $\Delta V_{in}$, the relation is vice versa. For a zero differential signal ($\Delta V_{in}=0$), the drain currents $I_{OM}$, $I_{OP}$ are substantially equal to each other. Hence, for positive $\Delta V_{in}$, the potential at the gate of feedback transistor 61 is smaller then at the gate of feedback transistor 62. For negative $\Delta V_{in}$, the relation is opposite.

Bias transistor 72 supplies a constant current $I_A$ which in node 65 is split into current $I_F$, and currents $I_1$, $I_2$.

The ratio between $I_1$ and $I_2$ depends on the ratio of the gate voltages of feedback transistors 61, 62 and therefore on the input signal $S_{in}$. The sum $I_1+I_2$ is constant. Current $I_F$ is also constant.

The voltage $V_A$ is via the S-D path of coupling transistor 64 related to the voltage $V_B$ at node 45.

Node 45 is a spike sensitive point. It is now supposed, that a positive spike signal having a spike frequency $f_S$ and amplitude $\Delta V_S$ reaches node 45. The spike signal is not differential and affects therefore both signal channels in the same way. The potential $V_B$ at node 45 is increased by $\Delta V_S$. Therefore, the gate-source voltages $V_{GS}$ of transistors 41 and 42 are decreased by $\Delta V_S$. The currents $I_{OM}$, $I_{OP}$ of transistors 41, 42 decrease. The gate voltages at feedback transistors 61, 62 increase. The currents $I_1$, $I_2$ increase and pull the voltage $V_A$ at node 65 down. Because of a constant current $I_F$, the voltage $V_B$ at node 45 follows the voltage $V_A$ at node 65 in the same direction. The spike signal with amplitude $\Delta V_S$ is compensated. The voltage drop at nodes 45 and 65 can be considered as a feedback signal $S_F$.

For a negative spike signal acting in the other direction, amplifier 10 behaves accordingly.

A spike signal can also be superimposed to the differential input signal $S_{in}$. The reaction of feedback stage 60 is the same.

Feedback stage 60 generates feedback signal $S_F$ only for common mode changes in differential stage 40. That means, signals are only attenuated when both signal channels are affected. For the differential input signal $S_{in}$ which carries the information to be amplified, there is no feedback and therefore no attenuation.

A desirable condition for the operation is that inductive loads 31 and 32 have a resonance frequency near to or equal to the spike signal frequency.

It is possible to modify amplifier 10 without departing from the scope of the invention. In the described embodiment, the transistors are P- and N-channel FETs. The channel assignment can be reversed or otherwise changed. Differential stage 40 and feedback stage 60 each comprise transistors of the same channel type. This is convenient, but not required. It should also be conceivable to have unique channel types throughout the circuit.

Figure 2:
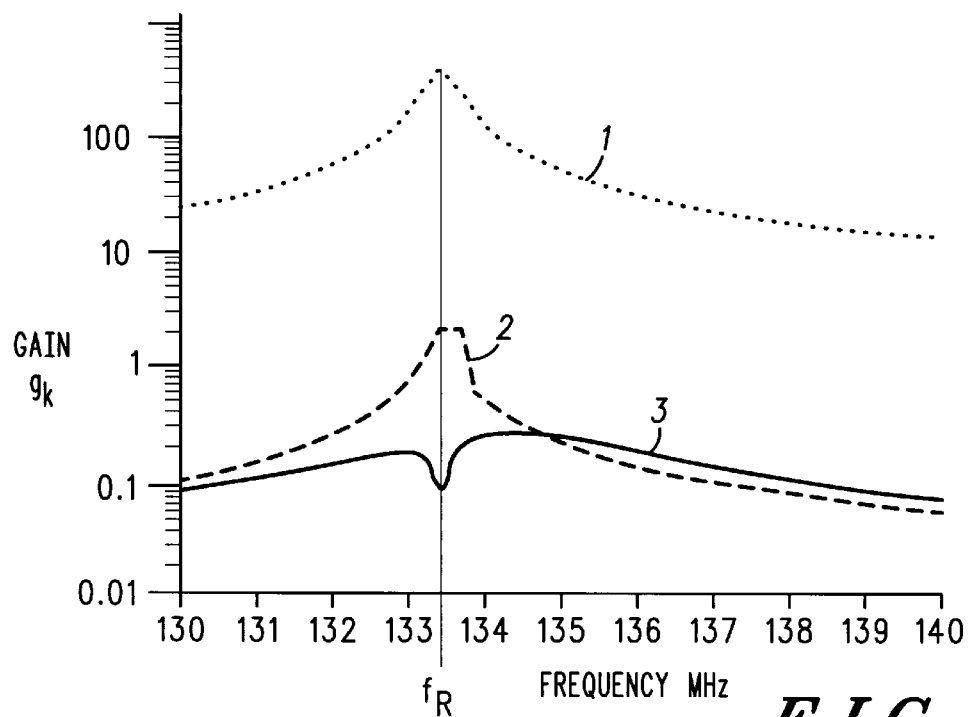
FIG. 2 is a diagram showing a gain-frequency-relation of the amplifier of FIG. 1 obtained by simulation.

FIG. 2 is a diagram showing the gain-frequency relation obtained by simulation for amplifier 10 and prior art amplifier 11. Prior art amplifier 11 is also indicated in FIG. 1. It has differential stage 40 but no feedback stage 60.

The frequencies $f_0$, $f_S$ are shown linearly at the horizontal axis. The gain $g_k$ k=1,2,3) is plotted in a logarithmic scale at the vertical axis.

For reference, graph 1 shows the signal gain $g_1=S_{out}/S_{in}$ for amplifier 10 and for prior art amplifier 11 in which feedback stage 60 is omitted. Graph 2 shows the uncompensated spike gain $g_2=\Delta V_{out}/\Delta V_S$ of prior art amplifier 11. Graph 3 shows the spike gain $g_3=\Delta V_{out}/\Delta V_S$ of amplifier 10 according to the invention. In both cases, the spike was applied to the semiconductor substrate of the integrated circuit amplifier.

As it can be seen in FIG. 2, there is a resonance frequency $f_R$ for which the signal gain $g_1$ is maximal and the spike gain $g_3$ is minimal. This resonance frequency $f_R$ is established by inductive loads 31 and 32.

At resonance frequency $f_R$, the spike gain $g_2$ of prior art amplifier 11 (graph 2) has a maximum, while the compensated spike gain $g_3$ has a minimum (graph 3). The ratio $g_2/g_3 \approx 30$ at $f_R$ shows that amplifier 10 of the invention has a significant better spike rejection than typical prior art amplifier 11.

The amplifier of the invention can be used in a wide range of applications. It is specially suitable to integrate the amplifier into digital signal processing (DSP) chips operating at intermediate frequencies (IF).

It will be appreciated that although only one particular embodiment of the invention has been described in detail, various modifications and improvements can be made by a person skilled in the art based on the teachings herein without departing from the scope of the present invention.

Accordingly, it is intended to include much more general aspects of the invention in the claims that follow.

We claim:

1. An amplifier comprising:

a differential stage with a first transistor and a second transistor each having a first main electrode coupled in a first node, and having a control electrode for receiving signals from a first input IP and a second input IM, and having a second main electrode for providing signals to a first output OM and a second output OP coupled to a first inductive load and a second inductive load, respectively; and a feedback stage coupled to said first output OM and said second output OP not via said first and second inductive loads, said feedback stage also coupled to said first node thereby providing a feedback signal responding to common mode changes in said differential stage.

2. An amplifier comprising:

a differential stage with a first transistor and a second transistor each having a first main electrode coupled in a first node, and having a control electrode for receiving signals from a first input IP and a second input IM, and having a second main electrode for providing signals to a first output OM and a second output OP coupled to a first inductive load and a second inductive load, respectively; and a feedback stage coupled to said first output OM and said second output OP, said feedback stage also coupled to said first node thereby providing a feedback signal responding to common mode changes in said differential stage, said feedback stage comprising a first feedback transistor and a second feedback transistor each having a main electrode coupled to a second node, said second node being coupled to said first node, said first feedback transistor having a control electrode coupled to said first output OM and said second feedback transistor having a control electrode coupled to said second output OP.

3. The amplifier of claim 2 further comprising a coupling transistor having a first main electrode coupled to said first node and having a second main electrode coupled to said second node.

4. The amplifier of claim 3 wherein said first transistor, said second transistor, said first feedback transistor, and said second feedback transistor are implemented by field effect transistors of a first conductivity type and wherein said coupling transistor is implemented by a field effect transistor of a second, opposite conductivity type.

5. The amplifier of claim 2 wherein said first transistor and said second transistor of said differential stage and said first feedback transistor and said second feedback transistor of said feedback stage are implemented by field effect transistors (FETs).

6. The amplifier of claim 5 wherein said transistors are implemented by FETs of a first channel type.

7. An amplifier comprising:
- a differential stage having a first main electrode coupled in a first node, a second main electrode for providing signals to a first inductive load and a third main electrode for providing signals to a second inductive load, and having differential control electrodes for receiving input signals; and
- a feedback stage having an amplifier with first and second inputs, wherein the first input of the feedback stage amplifier is coupled to the second main electrode and the second input of the feedback stage amplifier is coupled to the third main electrode and an output of said feedback stage is coupled to said first node, and wherein signals coupled, respectively, from said second and third main electrodes appearing on said first and second inputs of said feedback stage amplifier cause the feedback stage amplifier to produce a feedback signal responding to common mode changes in said differential stage.

8. The amplifier of claim 7 wherein the first and second inputs of the feedback stage amplifier are coupled to the second and third main electrodes without passing through the inductive loads.

* * * * *